(12) United States Patent
Endo et al.

(10) Patent No.: US 7,680,158 B2
(45) Date of Patent: Mar. 16, 2010

(54) LPP TYPE EXTREME ULTRA VIOLET LIGHT SOURCE APPARATUS AND DRIVER LASER FOR THE SAME

(75) Inventors: Akira Endo, Tokyo (JP); Tatsuya Ariga, Hiratsuka (JP); Takashi Suganuma, Hiratsuka (JP); Taisuke Miura, Hiratsuka (JP)

(73) Assignees: Komatsu Ltd., Tokyo (JP); Gigaphoton Inc., Tokyo (JP)

( * ) Notice: Subject to any disclaimer, the term of this patent is extended or adjusted under 35 U.S.C. 154(b) by 140 days.

(21) Appl. No.: 11/242,016

(22) Filed: Oct. 4, 2005

(65) Prior Publication Data
US 2006/0078017 A1 Apr. 13, 2006

(30) Foreign Application Priority Data
Oct. 7, 2004 (JP) ............................ 2004-295272
Aug. 9, 2005 (JP) ............................ 2005-230619

(51) Int. Cl.
*H01S 3/10* (2006.01)
(52) U.S. Cl. .................. 372/25; 372/29.02; 372/30; 372/31; 372/55
(58) Field of Classification Search .............. 372/21–60
See application file for complete search history.

(56) References Cited

U.S. PATENT DOCUMENTS

| 4,061,921 | A | * | 12/1977 | Cantrell et al. ............ 250/423 P |
| 4,112,390 | A | * | 9/1978 | Farcy ........................ 372/18 |
| 5,327,446 | A | * | 7/1994 | Waynant ...................... 372/61 |
| 5,909,306 | A | * | 6/1999 | Goldberg et al. .......... 359/337.1 |
| 6,016,324 | A | * | 1/2000 | Rieger et al. .................. 372/25 |
| 6,233,025 | B1 | * | 5/2001 | Wallenstein ................. 348/750 |
| 6,463,086 | B1 | * | 10/2002 | Stamm et al. .................. 372/20 |
| 6,697,408 | B2 | | 2/2004 | Kennedy et al. |
| 7,078,717 | B2 | * | 7/2006 | Mizoguchi .............. 250/504 R |
| 7,087,914 | B2 | | 8/2006 | Akins et al. |
| 2003/0189959 | A1 | * | 10/2003 | Erbert et al. .................. 372/25 |
| 2005/0167618 | A1 | * | 8/2005 | Hoshino et al. ......... 250/504 R |
| 2005/0205811 | A1 | * | 9/2005 | Partlo et al. ............. 250/504 R |

OTHER PUBLICATIONS

A. Endo et al. Development of Short Pulse and High Power CO2 Laser for EUV Lithography Proc. Of SPIE vol. 5918, 591801-1-591801-9, 2005.*

F. Kannari, "*Numerical Simulation on the Amplification of Picosecond Pulses in Multiatmosphere $CO_2$, Laser Media*", The Review of Laser Engineering, No. 17, No. 2, pp. 45-59.

(Continued)

*Primary Examiner*—Minsun Harvey
*Assistant Examiner*—Xnning Niu
(74) *Attorney, Agent, or Firm*—Wenderoth, Lind & Ponack, L.L.P.

(57) ABSTRACT

A driver laser for EUV light source apparatus which driver laser simultaneously achieves short-pulsing and multi-line oscillation. The driver laser includes: a short-pulse multi-line oscillated $CO_2$ laser oscillator having a device that shortens width of pulses included in a laser beam to be output and a device that suppresses amplitude of an oscillation spectrum exhibiting an energy peak value; and at least one amplifier that inputs the laser beam output from the short-pulse multi-line oscillated $CO_2$ laser oscillator and amplifies the input laser beam to output the amplified laser beam.

12 Claims, 9 Drawing Sheets

OTHER PUBLICATIONS

A. Endoh et al. "*Temperature Control of Multiline Oscillation of a Tea $CO_2$ Laser*", Journal of Applied Physics, 50(8). Aug. 1979, pp. 5176-5178.

I.V. Pogorelsky, et al., "*Subnanosecond Multi-Gigawatt $Co_2$ Laser*", IEEE Journal of Quantum Electronics, vol. 31, No. 3, Mar. 1995, pp. 556-566.

F. Rotermund, et al., "*Difference-Frequency Generation of Intense Femtosecond Pulses in the Mid-IR (4-12 µm) Using $HgGa_2S_4$, and $AgGaS_2$*", Optics Communications, 185 (2000), pp. 177-183.

V. Petro, et al., "*Generation of High-Power Femtosecond Light Pulses At 1 kHz in the Mid-Infrared Spectral Range Between 3 and 12 µm by Second-Order Nonlinear Processes in Optical Crystals*", Journal of Optics A: Pulse and Applied Optics 3, (2001), R1-R19.

\* cited by examiner

LPP TYPE EXTREME ULTRA VIOLET LIGHT SOURCE APPARATUS AND DRIVER LASER FOR THE SAME

BACKGROUND OF THE INVENTION

1. Field of the Invention

The present invention relates to an LPP (laser produced plasma) type EUV (extreme ultra violet) light source apparatus for generating extreme ultra violet light to be used for exposure of semiconductor wafers or the like. Further, the present invention relates to a driver laser for applying light to a target in the LPP type EUV light source apparatus.

2. Description of Related Art

Recently, as semiconductor processes become finer, the photolithography has been making rapid progress to finer fabrication, and, in the next generation, microfabrication of 100 nm to 70 nm, further, microfabrication of 50 nm or less will be required. For example, in order to fulfill the requirement for microfabrication of 50 nm or less, the development of exposure equipment with a combination of an EUV light source for generating ultra violet light of about 13 nm in wavelength and a reduced projection catoptric system is expected.

In such an EUV light source apparatus, generally, a short-pulse laser is used as a driving light source (driver), because the short-pulse laser is suitable for obtaining high CE (conversion efficiency from applied laser light to EUV light) in an LPP type EUV light source apparatus.

FIG. 10 is a schematic diagram showing a constitution of an oscillation amplification type laser to be used as a driver.

An oscillation amplification type laser 10 shown in FIG. 10 includes an oscillator 11 formed by a short-pulse $CO_2$ laser and an amplifier 12 for amplifying a laser beam generated by the short-pulse $CO_2$ laser. Here, in the case where the amplifier 12 has no light resonator, a laser system having such a constitution is referred to as "MOPA (Master Oscillator Power Amplifier) system". The amplifier 12 has a discharging device that excites by discharge a $CO_2$ laser gas containing carbon dioxide ($CO_2$), nitrogen ($N_2$), helium (He), and further containing hydrogen ($H_2$), carbon monoxide (CO), xenon (Xe), etc. according to need.

In the case where a resonator is provided in the amplification stage unlike the amplifier 12 shown in FIG. 10, laser oscillation can be performed by the single amplification stage. A laser system having such a constitution is referred to as "MOPO (Master Oscillator Power Oscillator) system".

The laser beam having energy "A" output from the oscillator 11 is amplified into a laser beam having desired energy "B" in the amplifier 12. The laser beam having energy "B" is collected through a laser beam propagation system or a lens, and applied to an EUV emission target material selected from among tin (Sn), xenon, etc.

In FIG. 10, only one stage of amplifier is provided for amplifying the laser energy "A" to laser energy "B". However, when desired laser energy "B" is not obtained, plural stages of amplifiers may be used.

Next, a constitutional example of short-pulse $CO_2$ laser as an oscillator will be described. FIG. 5 of U.S. Pat. No. 6,697,408 discloses a constitution of a short-pulse RF (Radio Frequency) excitation $CO_2$ laser. In this short-pulse RF-$CO_2$ laser, highly repetitive operation of laser pulses can be performed to about 100 kHz. Practically, it is necessary to obtain EUV emission of 100W class, however, when CE by the $CO_2$ laser is estimated at 0.5% and propagation loss is estimated at 70%, the output required for the $CO_2$ laser is about 60 kW. In order to achieve the output of 60 kW in the short-pulse laser, the repetition frequency of 50 kHz to 100 kHz is required when considering the durability etc. of optical elements and so on.

The reason is as described below. Assuming that the output energy of the $CO_2$ laser is $E_{total}$, the repetition frequency of pulse oscillation is $f_i$ (i=1, 2, 3, ...), and the light energy of a single pulse is $E_{pj}$ (j=1, 2, 3, ...), there is a relationship as $E_{total}=f_1 \times E_{p1}=f_2 \times E_{p2}$. Here, if $E_p$ is larger, the damage on optical elements through which the laser beam is transmitted becomes also larger, and thereby, the optical elements deteriorate rapidly. Accordingly, $E_p$ is desirably smaller. Therefore, to obtain the desired $E_{total}$, $E_p$ may be made smaller and the frequency $f_i$ may be made larger.

In order to realize such high repetition operation, an RF (Radio Frequency) excitation $CO_2$ laser is suitably used. The reason is that, although there is a TEA (Transverse Excitation Atmospheric) $CO_2$ laser as another pulsed $CO_2$ laser, the operation at about 2 kHz is a limit in the current technology.

Referring to FIG. 5 of U.S. Pat. No. 6,697,408, the laser apparatus includes a multipass waveguide laser oscillator 400 and a multipass waveguide laser amplifier 400a. A resonator of the oscillator 400 is formed by total reflection mirrors 408 and 406. A Q-switch, an RF discharge unit, and a thin film polarizer (TFP) are provided between the mirrors. When the Q-switch is OFF, a laser beam travels back and forth between the mirror 408 and the mirror 406, and light intensity increases because of simulated emission at the time. When the Q-switch is turned ON at the time when the light intensity increases sufficiently, highly peaked short pulses are reflected in the TFP 404 and directed into the multipass waveguide laser amplifier 400a shown in the lower part of FIG. 5 via a mirror 409 and a half-wave plate. Then, the introduced light is amplified in an amplifier, and a laser beam is extracted to the outside. The laser having such a constitution is referred to as "Q-switched cavity-dumped laser".

Further, related technologies are described in the following documents (1) to (5).

(1) Fumihiko Kannari, "Numerical Simulation on the Amplification of Picosecond Pulses in Multiatmosphere $CO_2$ Laser Media", The Review of Laser Engineering, No. 17, No. 2, pp. 45-59, Received on Aug. 18, 1988.

(2) A. Endoh et al., "Temperature control of multiline oscillation of a TEA $CO_2$ laser", Journal of Applied Physics, 50(8), August 1979, pp. 5176-5178.

(3) I. V. Pogorelsky et al., "Subnanosecond Multi-Gigawatt $CO_2$ laser", IEEE Journal of Quantum Electronics, Vol. 31, No. 3, March 1995, pp. 556-566.

(4) F. Rotermund et al., "Difference-frequency generation of intense femtosecond pulses in the mid-IR (4-12 μm) using $HgGa_2S_4$ and $AgGaS_2$", Optics Communications 185, 2000, pp. 177-183.

(5) V. Petrov et al., "Generation of high-power femtosecond light pulses at 1 kHz in the mid-infrared spectral range between 3 and 12 μm by second-order nonlinear processes in optical crystals", Journal of Optics A: Pure and Applied Optics 3, 2001, R1-R19.

As in conventional technologies, in the RF-$CO_2$ short-pulse laser using Q-switching, since the laser gas pressure is low (generally, 40 Torr to 100 Torr), broadening of each $CO_2$ laser transition is not sufficient and the gain spectrum is modulated in a comb-like pattern. That is, in the case where the laser gas is at low pressure, as shown in FIG. 11, the oscillation spectrum of $CO_2$ laser becomes not continuous but discrete. As a result, as disclosed in the document (1), a gain in the amplification process by simulated emission, saturation thereof and a pulse shape depend on a degree of matching between a spectrum of the laser pulse and a gain spectrum.

By the way, in the case where the output light of the oscillation stage laser is directed into the amplifier in the subsequent stage and amplified as in the above-mentioned MOPA or MOPO system laser, the output spectrum of the oscillation stage laser largely affects the amplification efficiency. For example, if the oscillation stage laser has a single spectrum, that is, light energy is concentrated within a specific narrow wavelength band, the gain becomes readily saturated in the amplification stage. In the case where such a single-spectrum laser beam is input to the amplification stage of the above-mentioned MOPA or MOPO system laser and amplified, since the amplifiable spectrum is limited to one, the amplification efficiency in the multi-spectrum (multi-line) amplifiable amplification stage becomes lower. That is, since only one spectrum contributes to amplification and the rest of the spectrums cannot be laser-oscillated and contribute to amplification, and thereby, a great part of gain is wasted. This means that high output is not obtained in the amplification in the amplification stage.

SUMMARY OF THE INVENTION

In order to solve the above-mentioned problems, a driver laser for extreme ultra violet light source apparatus according to one aspect of the present invention comprises: a short-pulse multi-line oscillated $CO_2$ laser oscillator having a device that shortens width of pulses included in a laser beam to be output and a device that suppresses amplitude of an oscillation spectrum exhibiting an energy peak value; and at least one amplifier that inputs the laser beam output from the short-pulse multi-line oscillated $CO_2$ laser oscillator and amplifies the input laser beam to output the amplified laser beam.

Further, an LPP type extreme ultra violet light source apparatus according to one aspect of the present invention comprises: a driver laser for the extreme ultra violet light source apparatus including a short-pulse multi-line oscillated $CO_2$ laser oscillator having a device that shortens width of pulses included in a laser beam to be output and a device that suppresses amplitude of an oscillation spectrum exhibiting an energy peak value, and at least one amplifier that inputs the laser beam output from the short-pulse multi-line oscillated $CO_2$ laser oscillator and amplifies the input laser beam to output the amplified laser beam; a target supplier that supplies a target material; and an optical system that guides the laser beam output from the driver laser such that the target material supplied from the target supplier is irradiated with the laser beam.

According to the present invention, by suppressing amplitude of the oscillation spectrum that exhibits an energy peak value of the laser beam, the oscillation of other spectrums is promoted and the laser beam is short-pulsed, and therefore, short-pulsed and multi-spectrum oscillation can be performed. As a result, the amplification efficiency in the amplifier can be increased and the short-pulsed laser beam can be amplified to a higher level.

DESCRIPTION OF THE PREFERRED EMBODIMENTS

Figure 1:
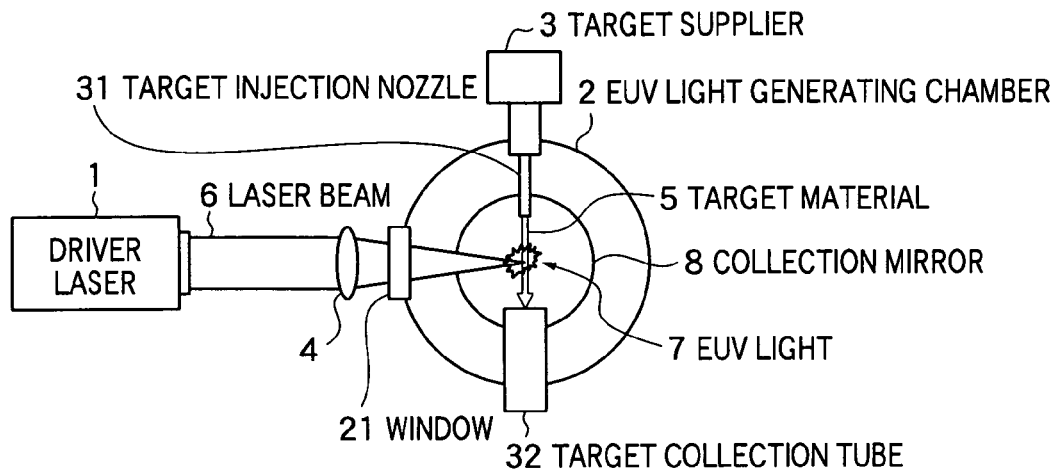
FIG. 1 is a schematic diagram showing an outline of an LPP type EUV light source apparatus to which a driver laser for extreme ultra violet light source apparatus according to the present invention is applied.

Hereinafter, preferred embodiments of the present invention will be described in detail by referring to the drawings. The same reference numerals are assigned to the same component elements and the description thereof will be omitted.

FIG. 1 is a schematic diagram showing an outline of an LPP type EUV light source apparatus to which a driver laser for extreme ultra violet light apparatus (hereinafter, also simply referred to as "driver laser") according to the present invention is applied. As shown in FIG. 1, the LPP type EUV light source apparatus includes a driver laser 1, an EUV light generating chamber 2, a target supplier 3, and an optical system 4.

The driver laser 1 is an oscillation amplification type laser device that generates a laser beam for driving to be used for exciting a target material. The constitution of the drive laser 1 will be described later in detail.

The EUV light generating chamber 2 is a vacuum chamber in which EUV light is generated. In the EUV light generating chamber 2, a window 21 is provided for transmitting a laser beam 6 generated from the driver laser 1 through into the EUV light generating chamber 2. Further, within the EUV light generating chamber 2, a target injection nozzle 31, a target collection tube 32 and a collection mirror 8 are provided.

The target supplier 3 supplies a target material to be used for generating EUV light through the target injection nozzle 31 as a part of the target supplier 3 into the EUV light generating chamber 2. Within the supplied target material, a part of the material applied with no laser beam and no longer required is collected by the target collection tube 32. As target materials, various known materials can be used. Further, status of the target material may be any of solid, liquid, or gas, and they may be supplied to space within the EUV light generating chamber 2 in any known form such as continuous flow (target jet) and droplets. For example, in the case where a liquid xenon (Xe) target is used as the target material, the target supplier 3 is formed by a compressed gas cylinder for supplying a high-purity xenon gas, a mass flow controller, a cooling device that liquefies the xenon gas, a target injection nozzle, etc. Further, when droplets are produced, a vibrating device such as a piezoelectric element is added to the constitution including them.

The optical system 4 includes a collection lens, for example, and collects the laser beam 6 output from the driver laser 1 such that a focal point may be formed in an orbit of the target material. Thereby, a target material 5 is excited to form plasma and EUV light 7 is generated.

The collection mirror 8 is a concave mirror having an Mo/Si film that reflects light of 13.5 nm with high reflectance formed on a surface thereof, and guides the generated EUV light 7 to a transmission optical system by reflecting and collecting the light. Further, the EUV light is guided to an exposure apparatus or the like via the transmission optical system. In FIG. 1, the collection mirror 8 collects EUV light toward the front of the paper.

Next, a driver laser according to the first embodiment of the present invention will be described. The embodiment is characterized by using a short-pulse multi-spectrum (multi-line) $CO_2$ laser as an oscillation stage laser in the driver laser 1 (oscillation amplification type laser device). Since the use of the short-pulse multi-spectrum $CO_2$ laser enables utilization of amplification ability in the amplification stage with high efficiency, high-power short pulses can be obtained by the amplification stage. The oscillation amplification type laser with such a short-pulse multi-spectrum $CO_2$ laser as the oscillation amplification is used as a laser beam application source in the LPP type EUV light source apparatus for generating EUV light by applying a laser beam to a target material of xenon (Xe), tin (Sn), or the like. Thereby, a high-energy short-pulsed laser beam is applied to a target material and conversion efficiency from the applied laser beam into EUV light becomes higher, and it is useful to achieve the above-mentioned objects for realizing 100 W-class EUV light generation.

Figure 2:
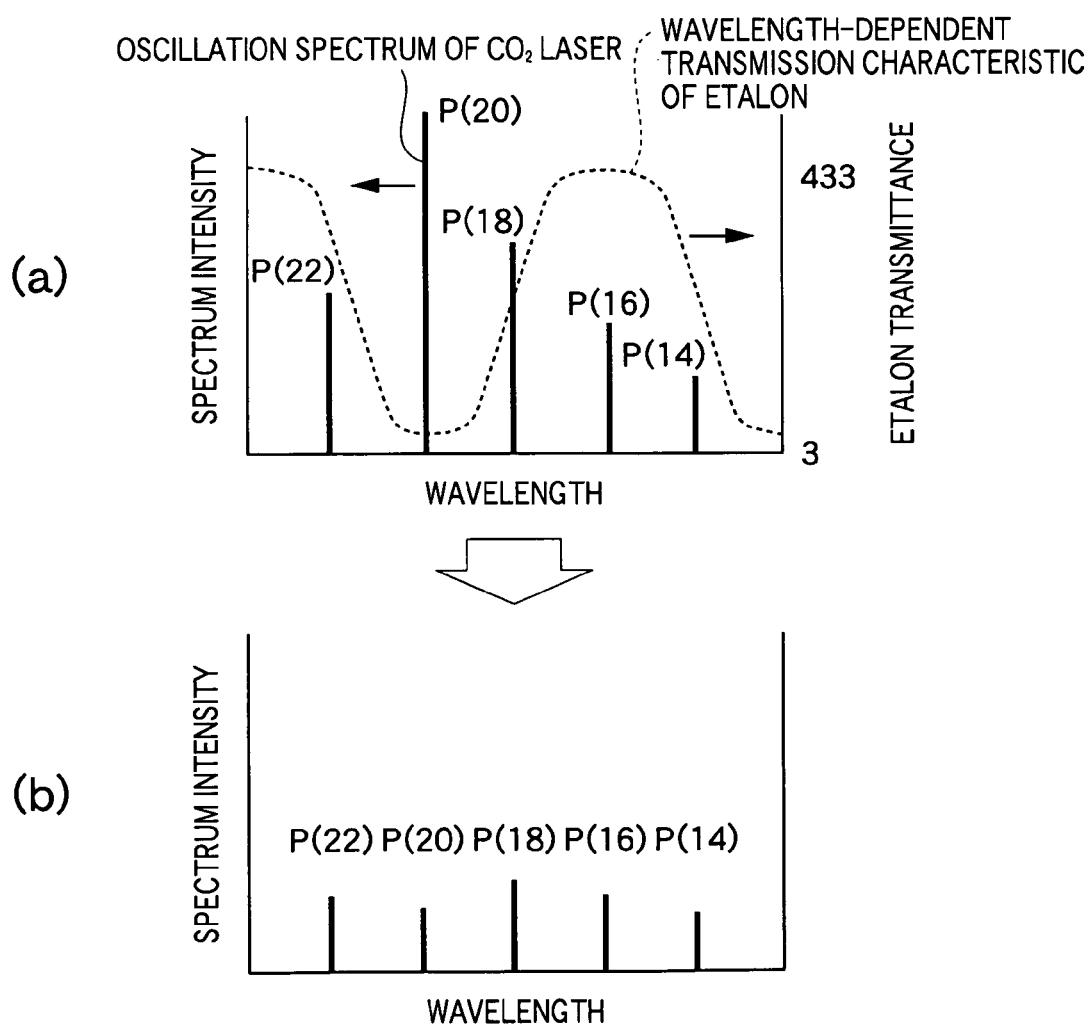
FIG. 2 is diagram for explanation of a principle of suppression of high-intensity oscillation spectrum components and smoothing of oscillation spectrum intensity by an etalon.

Further, in the embodiment, control of oscillation spectrum is performed in order to perform multi-line oscillation using a short-pulse $CO_2$ laser. FIG. 2 is a diagram for explanation of a principle of suppression of high-intensity oscillation spectrum components and smoothing of oscillation spectrum intensity performed in the short-pulse multi-spectrum $CO_2$ laser.

Here, in a laser beam, plural oscillation spectrum components having different intensity from one another exist. As shown in FIG. 2(a), in a $CO_2$ laser beam, there is a peak in spectrum component P(20). If it is possible that the amplitude of this spectrum component P(20) is suppressed and oscillation of other spectrum components P(18), P(16), P(14) etc. are promoted, multi-spectrum (multi-line) oscillation can be realized. For this purpose, for example, oscillation of other spectrum components P(18), P(16), P(14) etc. may be promoted by inserting an optical element having loss dependent on a spectrum into the resonator of the short-pulse multi-spectrum $CO_2$ laser. As the optical element having loss dependent on a spectrum, for example, an etalon is used. Adjustment of the etalon enables multi-line oscillation. As a material of the etalon, a material having high transmittance for a wavelength of 10.6 μm such as ZnSe and Irtran-2 is desirably used.

Accordingly, as a device that suppresses the amplitude of the oscillation spectrum exhibiting the energy peak value, an etalon having such wavelength-dependent transmittance is inserted into the resonator. Then, while the intensity of spectrum components with high peak intensity is suppressed, the etalon is adjusted such that the intensity of the spectrum components with low peak intensity may not become lower. Thereby, as shown in FIG. 2(b), the intensity of oscillation spectrum can be smoothed. That is, making the intensity oscillation spectrums nearly equal enables amplification of spectrum components initially with low oscillation intensity.

In the embodiment, transmittance is controlled such that the etalon exhibits the wavelength-dependent transmission characteristic shown by the broken line in FIG. 2(a) by adjusting inclination of the etalon relative to the optical axis or temperature thereof.

Next, a specific constitution for realizing a short-pulse multi-spectrum $CO_2$ laser will be described by referring to FIGS. 3A to 7B.

Figure 3A:
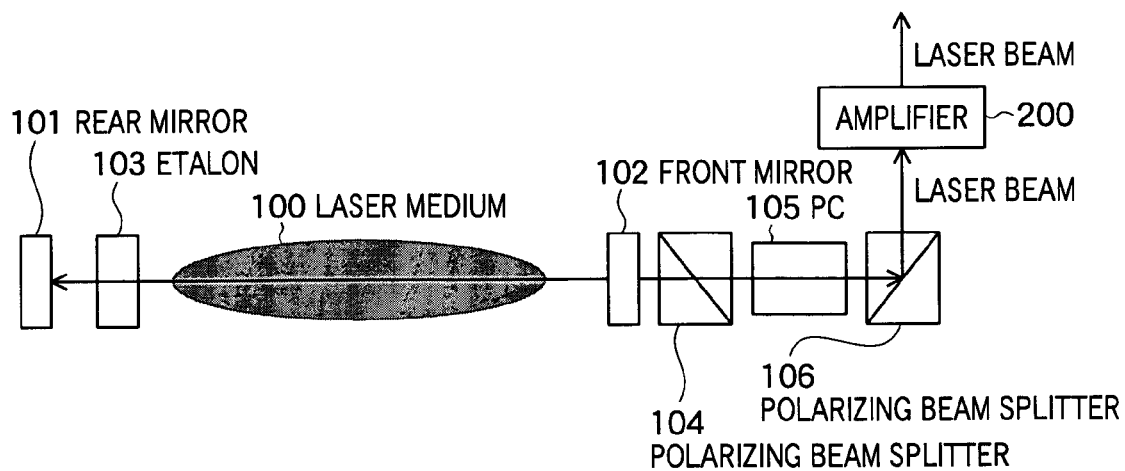
FIG. 3A is a schematic diagram showing a first constitutional example of the driver laser according to the first embodiment of the present invention.

FIG. 3A is a schematic diagram showing a first constitutional example of the driver laser according to the embodiment. As shown in FIG. 3A, the driver laser includes a short-pulse multi-spectrum $CO_2$ laser having a laser medium 100, a rear mirror 101 and a front mirror 102 forming a resonator, an etalon 103, polarizing beam splitters 104 and 106, and a Pockels cell (PC) 105, and an amplifier 200 for inputting a short-pulsed laser beam output from the short-pulse multi-spectrum $CO_2$ laser and amplifying and outputting it.

A seed laser passes through the laser medium 100 while traveling between the rear mirror 101 and the front mirror 102 back and forth, and CW (continuous wave)-excited or pulse-excited. At that time, as described above, suppression and amplification of oscillation intensity are performed by the etalon 103 on plural spectrum components contained in the laser beam.

The polarizing beam splitters 104 and 106 and the Pockels cell (PC) 105 form a device that shortens width of pulses included in the laser beam to be output.

The polarizing beam splitters 104 and 106 separate incident light into p-polarized light and s-polarized light by outputting p-polarized light in the same direction as the traveling direction of the incident light and output s-polarized light in a direction (upward in the drawing) nearly perpendicular to the incident light.

Further, the Pockels cell (Q-switch) is an optical element utilizing EO (electro optic) effect that the refractive index and anisotropy of a crystal change by applying an electric field to the crystal. Control of the electric field applied to the Pockels cell enables the rotation of the polarization plane of the light transmitted through the cell to a desired angle. In the constitutional example, the polarization plane of the light is rotated by $\pi/2$ (90°) due to the Pockels cell 105. That is, at each time when the light is transmitted through the activated Pockels cell, p-polarized light becomes s-polarized light and s-polarized light becomes p-polarized light.

Figure 3B:
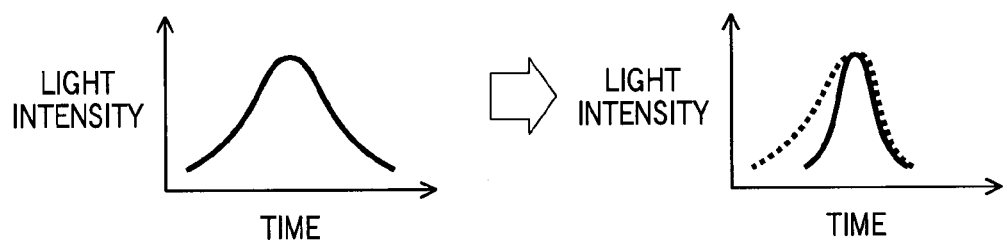
FIG. 3B is a diagram for explanation of an operation of a short-pulsing device in the first constitutional example.

The laser beam output to the outside of the resonator formed by the rear mirror 101 and the front mirror 102 is cut into a desired pulse width by activating and deactivating the Pockels cell 105 with predetermined timing. Thereby, as shown in FIG. 3B, the multi-line-oscillated laser beam can be short pulsed.

Figure 4A:
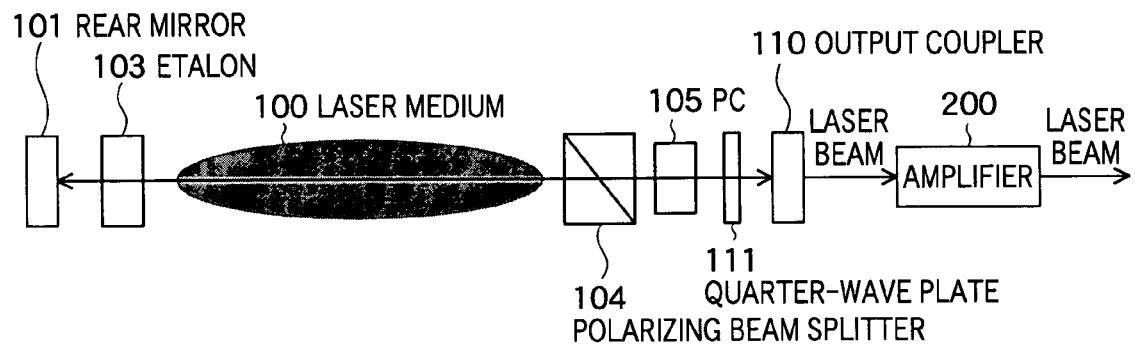
FIGS. 4A and 4B are schematic diagrams showing a second constitutional example of the driver laser according to the first embodiment of the present invention.
Figure 4B:
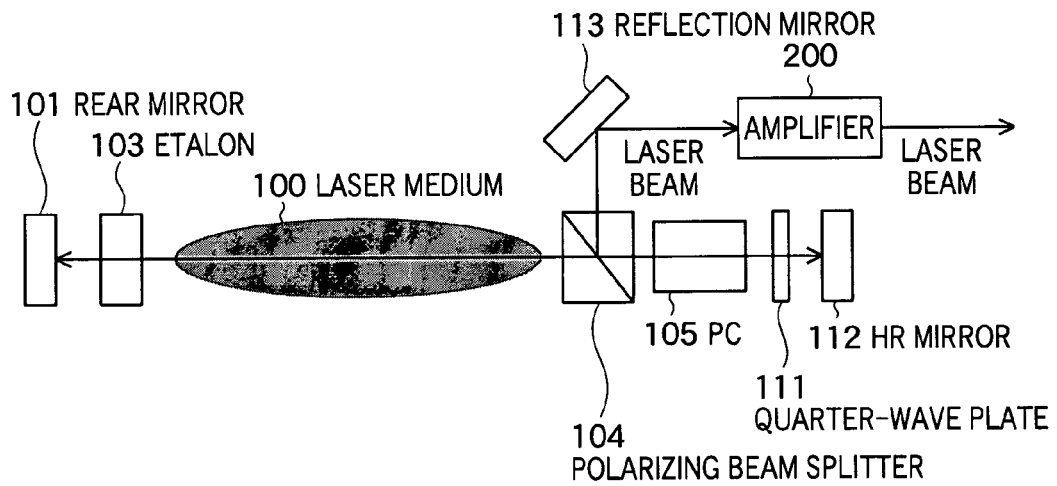

FIGS. 4A and 4B show a second constitutional example of the driver laser according to the embodiment. In the constitutional example, a laser beam is short-pulsed within a resonator of a short-pulse multi-spectrum $CO_2$ laser.

As shown in FIG. 4A, in the short-pulse multi-spectrum $CO_2$ laser in the constitutional example, compared to the constitution shown in FIG. 3A, a resonator is formed by a rear mirror 101 and an output coupler 110, and further, a polarizing beam splitter 104, a Pockels cell 105, and a quarter-wave plate 111 are provided within the resonator. These polarizing beam splitter 104, Pockels cell 105, and quarter-wave plate 111 form a device that shortens width of pulses included in the laser beam to be output. In the constitutional example, the polarization plane of light is rotated by $\pi/4$ (45°) due to the Pockels cell 105. That is, at each time when the light is transmitted through the activated Pockels cell back and forth, p-polarized light becomes s-polarized light and s-polarized light becomes p-polarized light. Further, the quarter-wave plate 111 rotates the polarization plane of the light transmitted through the plate by $\pi/4$ (45°).

Further, in the short-pulse multi-spectrum $CO_2$ laser shown in FIG. 4B, compared to the constitution shown in FIG. 4A, a resonator is formed by providing a high reflectance (HR) mirror 112 in place of the output coupler 110. Further, in FIG. 4B, switching of the Pockels cell 105 is controlled to take out the laser beam upward in the drawing, and accordingly, a reflection mirror 113 for changing the direction of the taken out laser beam is provided. Such a constitution is referred to as "Q-switched cavity-dumped laser".

As in the constitutional example, in the case where the laser beam multi-line-oscillated through the etalon 103 is short-pulsed within the resonator by the switching control of the Pockels cell 105, there is an advantage as described below. That is, since there is no longer any decrease in energy corresponding to the cut off part when the pulses are cut out outside of the resonator by oscillating the laser beam while short-pulsing it, the oscillation efficiency becomes higher.

Figure 5A:
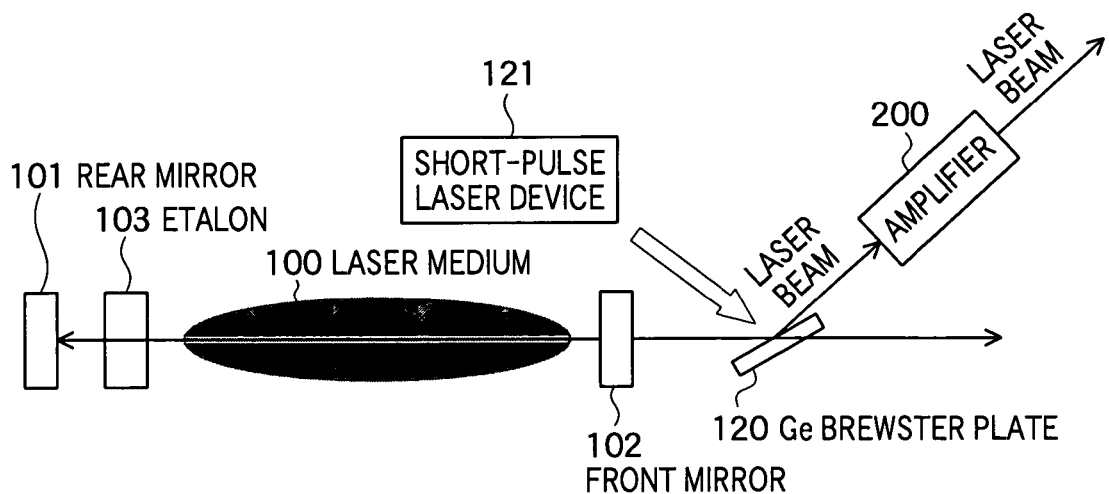
FIG. 5A is a schematic diagram showing a third constitutional example of the driver laser according to the first embodiment of the present invention.

FIG. 5A is a schematic diagram showing a third constitutional example of the driver laser according to the embodiment. In the constitutional example, an optical switching element is used as a device that shortens width of pulses included in a laser beam to be output from the short-pulse multi-spectrum $CO_2$ laser.

As shown in FIG. 5A, in the short-pulse multi-spectrum $CO_2$ laser in the constitutional example, a germanium (Ge) Brewster plate (germanium mirror) 120 is provided as the optical switching element in place of the polarizing beam splitters 104 and 106 and Pockels cell 105. Further, a short-pulse laser device (e.g., Nd:YAG laser) 121 that generates a short-pulsed laser beam to be applied to the Ge Brewster plate 120 is provided.

Figure 5B:
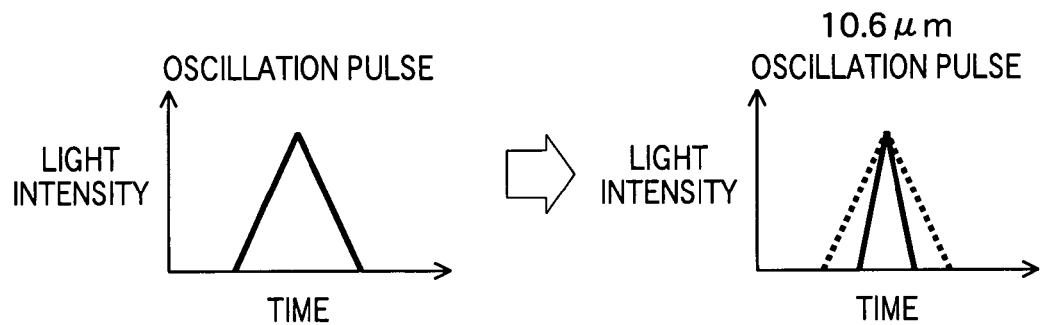
FIG. 5B is a diagram for explanation of an operation of a short-pulsing device in the third constitutional example.

The Ge Brewster plate 120 is normally provided so as to form a Brewster angle relative to the optical axis of the laser beam output from the resonator. When the Ge Brewster plate 120 is applied with a laser beam, the refractive index of the plate surface changes during the application of the laser beam. As a result, the Brewster angle of the Ge Brewster plate 120 also changes and the laser beam output from the resonator is reflected. Accordingly, the Ge Brewster plate 120 is applied with a short-pulsed laser beam having a desired width, and thereby, the multi-line-oscillated laser beam can be short-pulsed as shown in FIG. 5B.

Figure 6A:
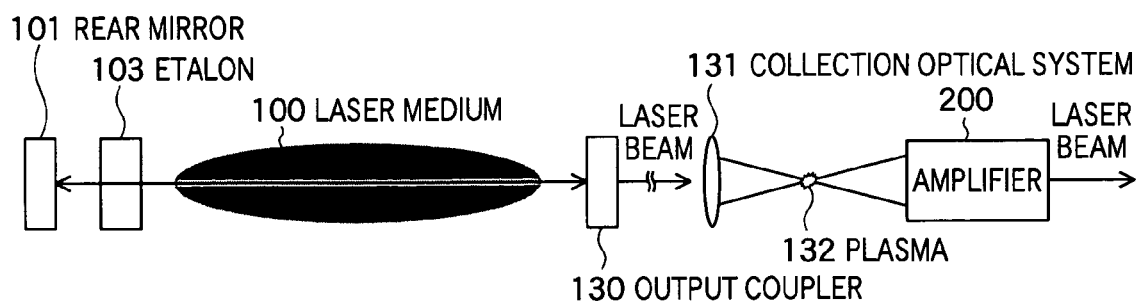
FIG. 6A is a schematic diagram showing a fourth constitutional example of the driver laser according to the first embodiment of the present invention.

FIG. 6A is a schematic diagram showing a fourth constitutional example of the driver laser according to the embodiment. In the constitutional example, a plasma shutter is used as a device that shortens width of pulses included in a laser beam to be output from the short-pulse multi-spectrum $CO_2$ laser.

As shown in FIG. 6A, the short-pulse multi-spectrum $CO_2$ laser in the constitutional example includes a rear mirror 101 and an output coupler 130 forming a resonator, a laser medium 100 and an etalon 103 provided within the resonator, and a collection optical system (e.g., collection lens) 131 for collecting a laser beam.

Figure 6B:
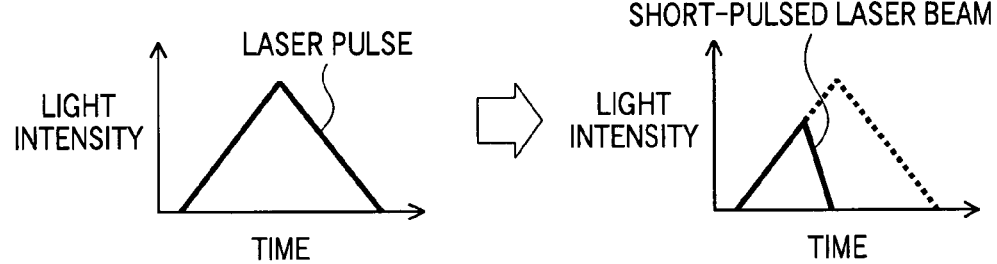
FIG. 6B is a diagram for explanation of an operation of a short-pulsing device in the fourth constitutional example.

A laser beam oscillated within the resonator is output to the outside of the resonator, the laser beam is collected by the collection optical system 131, and plasma 132 is generated in the gas. Since the plasma 132 absorbs the laser beam, the latter part of the laser pulse is absorbed and, as a result, the laser pulse is cut out to be short-pulsed as shown in FIG. 6B. The gas (plasma gas) may be air or may be helium (He), nitrogen ($N_2$), argon (Ar), or the like. In the latter case, plasma may be generated within a gas cell filled with the plasma gas.

Figure 7A:
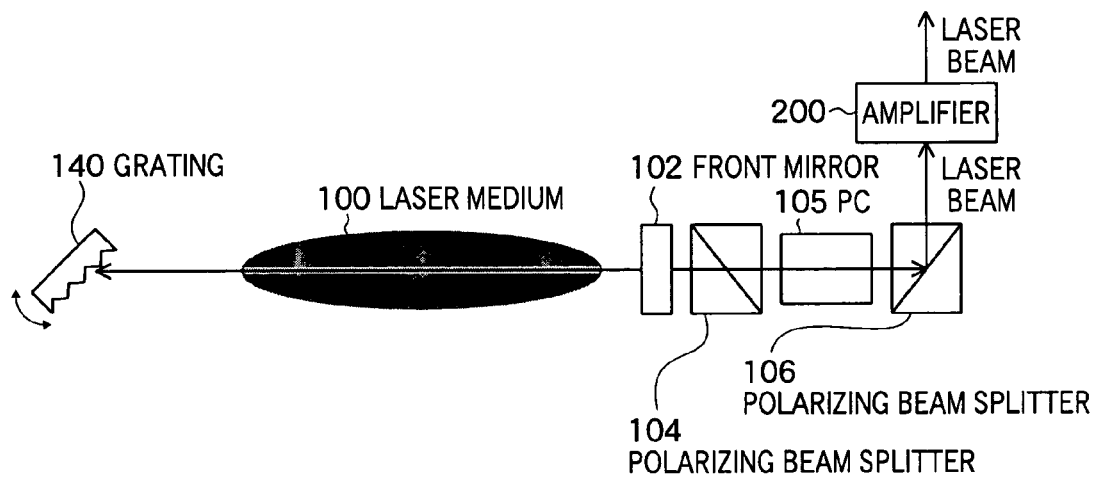
FIGS. 7A and 7B are schematic diagrams showing a fifth constitutional example of the driver laser according to the fifth embodiment of the present invention.
Figure 7B:
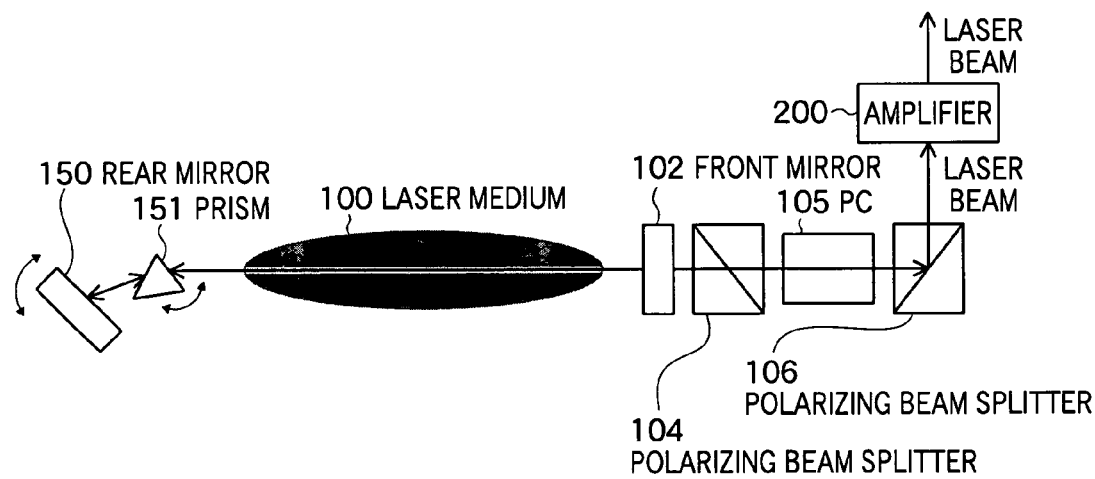

FIGS. 7A and 7B are schematic diagrams showing a fifth constitutional example of the driver laser according to the embodiment. In the short-pulse multi-spectrum $CO_2$ laser shown in the above-mentioned first to fourth constitutional examples, multi-line oscillation of a laser beam is performed using the etalon, however, an optical element such as a grating and prism or a combination of them may be used as wavelength splitting means (multi-line oscillation device) in place of the etalon.

For example, in FIG. 7A, a resonator is formed by a grating 140 and a front mirror 102. In such a constitution, the oscillation wavelength, i.e., the intensity of oscillation spectrum can be adjusted by rotating the grating. Alternatively, a prism may be provided in place of the grating 140 shown in FIG. 7A.

Further, as shown in FIG. 7B, a resonator may be formed by a rear mirror 150 and a front mirror 102, and a prism 151 may be provided within the resonator. In this case, the oscillation wavelength can be adjusted by rotating both the rear mirror 150 and the prism 151.

Such a constitution using a grating and prism as wavelength splitting means can be applied to the first to fourth constitutional examples.

Next, a driver laser according to the second embodiment of the present invention will be described by referring to FIGS. 8 and 9.

Figure 8:
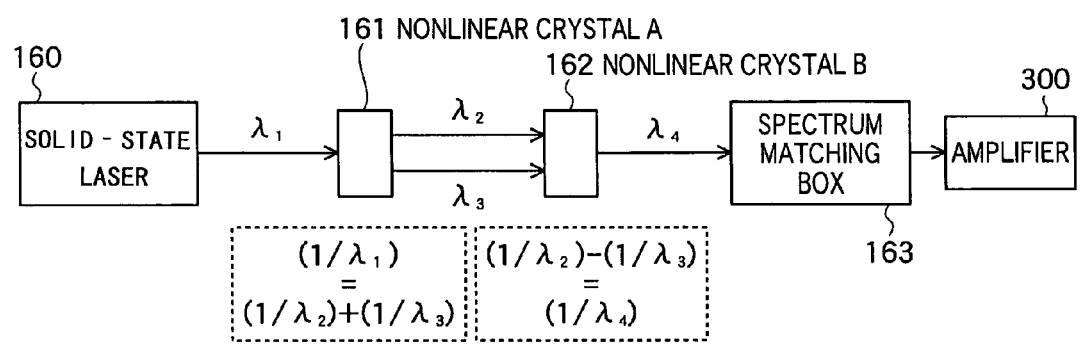
FIG. 8 is a schematic diagram showing a constitution of a driver laser for extreme ultra violet light source apparatus according to the second embodiment of the present invention.

FIG. 8 is a schematic diagram showing a constitution of the driver laser according to the embodiment. The driver laser includes a solid-state laser 160, a nonlinear crystal A: 161, a nonlinear crystal B: 162, and an amplifier 300. The embodiment is characterized by using the solid-state laser 160 for oscillating short pulses as the oscillation stage laser in the driver laser shown in FIG. 1. Further, a $CO_2$ laser is used as the amplification stage laser (amplifier 300).

As shown in FIG. 8, in the embodiment, in order to realize multi-transverse mode oscillation in the wavelength region around 10 μm, two kinds of nonlinear crystals (nonlinear crystal "A": 161 and nonlinear crystal "B": 162) as optical parametric oscillation devices are used with the solid-state laser 160. Further, desirably, a spectrum matching box 163 is used in the subsequent stage of the optical parametric oscillation device.

As the solid-state laser 160, for example, a titanium sapphire laser for oscillating in the wavelength region around 660 nm to 900 nm. Further, as a crystal of the nonlinear crystal "A": 161, for example, BBO ($\beta$-$BaB_2O_4$) is used. The nonlinear crystal "A": 161 is phase-matched with the oscillation wavelength $\lambda_1$ of the solid-state laser 160, and thereby, according to the relationship $1/\lambda_1 = 1/\lambda_2 + 1/\lambda_3$, a wavelength component having wavelength $\lambda_2$ (wavelength component $\lambda_2$) and a wavelength component having wavelength $\lambda_3$ (wavelength component $\lambda_3$) are output from the nonlinear crystal "A": 161. The nonlinear crystal "B": 162 is phase-matched with those wavelength components $\lambda_2$ and $\lambda_3$, and thereby, wavelength $\lambda_4$ corresponding to a difference frequency between the wavelength component $\lambda_2$ and the wavelength component $\lambda_3$ is obtained. As the nonlinear crystal "B": 162, for example, $AgGaS_2$ or $HgGa_2S_2$ is used, and thereby, a wideband laser beam from 9 μm to 12 μm is obtained in the difference frequency. This can be realized in the case of using a laser device capable of wideband oscillation like a titanium sapphire laser. For example, non-patent document 3 and non-patent document 4 disclose, in the case where $\lambda_1$=950 nm is set, when $\lambda_2$=1400.88 nm and $\lambda_3$=1614.21 nm are set, $\lambda_4$=1060 nm is obtained.

Thus, an obtained light pulse having the wavelength of $\lambda 4$ has a wideband, but a continuous spectrum waveform. The spectrum matching box 163 converts such a light pulse into a light pulse having a comb-like spectrum waveform. This is because the gain spectrum of the CO2 laser amplifier (amplifier 300) provided in the subsequent stage of the oscillation stage has a comb-like waveform, and, when the light pulse having a continuous spectrum waveform is input without change, it can not be amplified with efficiency.

As the spectrum matching box 163, for example, a regenerative amplifier of $CO_2$ laser can be used. The regenerative amplifier is formed by inserting an optical gate formed by a Pockels cell and a polarizing beam splitter into a laser resonator.

Figure 9:
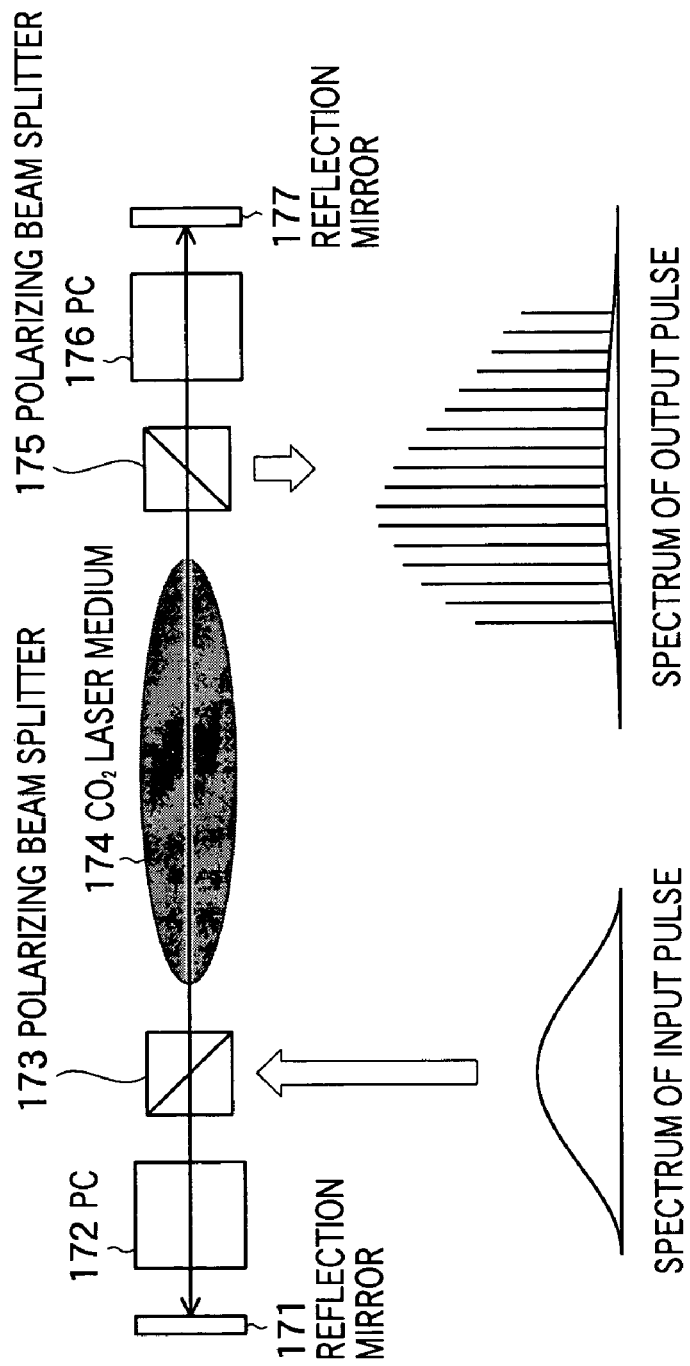
FIG. 9 is a schematic diagram showing a constitutional example of a spectrum matching box shown in FIG. 8.
Figure 10:
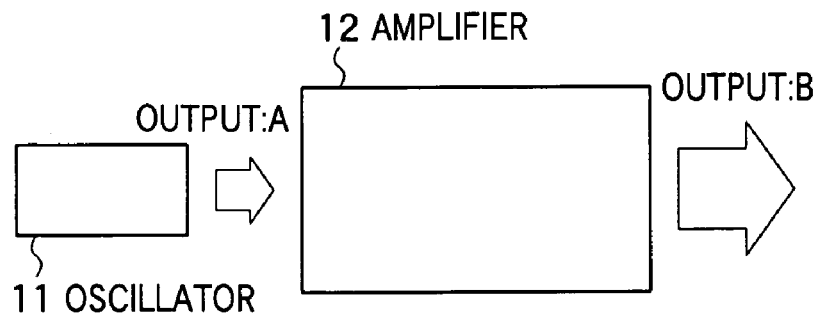
FIG. 10 is a schematic diagram showing a constitution of an oscillation amplification type laser.
Figure 11:
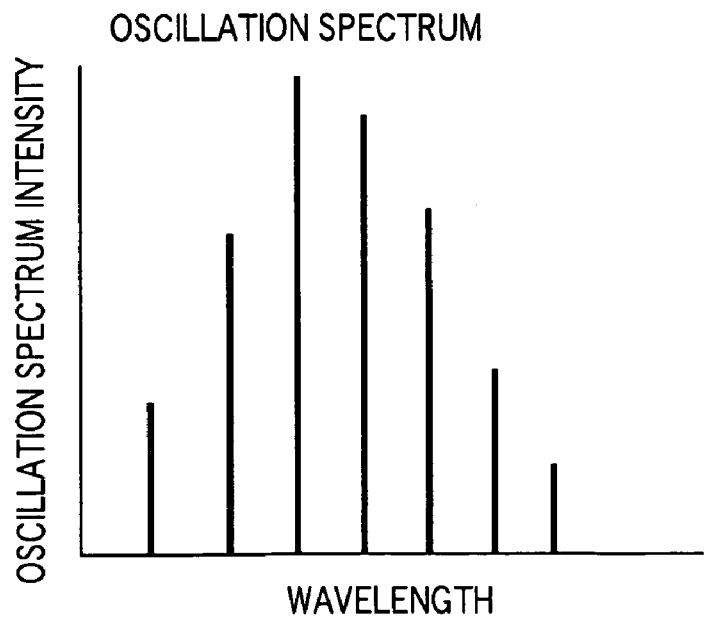
FIG. 11 shows an oscillation spectrum at the time of low gas pressure operation of $CO_2$ laser and a pulse waveform at that time.

The spectrum matching box 163 shown in FIG. 9 has reflection mirrors 171 and 177, Pockels cells (PCs) 172 and 176, polarizing beam splitters 173 and 175, and a CO2 laser medium 174.

The reflection mirrors 171 and 177 and the $CO_2$ laser medium 174 form a resonator.

The Pockels cells 172 and 176 are activated so as to rotate the polarization plane of light passing through them by $\pi/4$ (45°) That is, at each time when the light is transmitted through the activated Pockels cells 172 and 176 back and forth, p-polarized light becomes s-polarized light and s-polarized light becomes p-polarized light. Further, the polarizing beam splitters 173 and 175 reflect the incident s-polarized light in a direction at an angle nearly perpendicular to the incident direction and passes through the incident p-polarized light without change. These Pockels cell 172 and polarizing beam splitter 173 form an input optical gate and the Pockels cell 176 and polarizing beam splitters 175 form an output optical gate.

When a light pulse is input to the resonator, the Pockels cell 172 is activated. Then, when the light pulse is input to the polarizing beam splitter 173, the s-polarized component of the light pulse is reflected and guided in the direction toward the Pockels cell 172. Furthermore, the s-polarized component is transmitted through the Pockels cell 172 back and forth via the reflection mirror 171, and its polarization plane is rotated by 90°. Afterwards, the Pockels cell 172 is deactivated, and the light pulse (p-polarized light) travels between the reflection mirror 171 and the reflection mirror 177 back and forth via the $CO_2$ laser medium 174.

The $CO_2$ laser medium 174 has a comb-like gain spectrum. Accordingly, at each time when a light pulse passes through the $CO_2$ laser medium 174, only a wavelength component matching the comb-like gain spectrum of $CO_2$ of continuous spectrum components that it has at the time of input to the resonator is amplified. Therefore, the light pulse is allowed to travel back and forth within the resonator to pass through the laser medium at many times, a light pulse having a comb-like spectrum (multi-spectrum, multi-line) completely matching the comb-like gain spectrum of $CO_2$ can be generated from the continuous spectrum.

Further, when a light pulse is output from the resonator, the Pockels cell 176 is activated. Thereby, the polarization plane of the light pulse transmitted through the Pockels cell 176 back and forth via the reflection mirror 177 is rotated by 90°.

As a result, the light pulse (s-polarized light) is reflected by the polarizing beam splitter 175 and output from the resonator.

The invention claimed is:

1. A driver laser for an extreme ultra violet light source apparatus, said driver laser comprising:
   a short-pulse multi-line oscillated $CO_2$ laser oscillator for performing short-pulse multi-line oscillation, said laser oscillator including
      a device having a wavelength-dependent transmittance that suppresses amplitude of an oscillation spectrum exhibiting an energy peak value and does not suppress intensity of spectrum components with low peak intensity, and
      a device that shortens width of pulses included in a laser beam to be output by cutting the laser beam into a desired pulse width; and
   at least one amplifier that inputs the laser beam output from said short-pulse multi-line oscillated $CO_2$ laser oscillator and amplifies the input laser beam to output the amplified laser beam.

2. A driver laser for an extreme ultra violet light source apparatus, said driver laser comprising:
   a short-pulse multi-line oscillated laser oscillator for performing short-pulse multi-line oscillation, said laser oscillator including
      a laser that outputs a short-pulsed laser beam, and
      an optical parametric oscillation device that causes optical parametric oscillation based on the short-pulsed laser beam output from said laser such that the short-pulsed laser beam has a wider bandwidth;
   at least one amplifier that inputs the laser beam output from said short-pulse multi-line oscillated laser oscillator and amplifies the input laser beam to output the amplified laser beam; and
   a spectrum matching box using a regenerative amplifier of a $CO_2$ laser, said spectrum matching box matching the laser beam having the wider bandwidth due to said optical parametric oscillation device with an oscillation spectrum of said at least one amplifier by converting the laser beam into a light pulse having a comb-like spectrum waveform.

3. A driver laser according to claim 1, wherein said device having a wavelength-dependent transmittance that suppresses amplitude of an oscillation spectrum exhibiting an energy peak value and does not suppress intensity of spectrum components with low peak intensity comprises an etalon.

4. A driver laser according to claim 3, wherein said device that shortens width of pulses included in a laser beam to be output by cutting the laser beam into a desired pulse width comprises a first polarizing beam splitter, a second polarizing beam splitter, and a Pockels cell.

5. A driver laser according to claim 3, wherein said device that shortens width of pulses included in a laser beam to be output by cutting the laser beam into a desired pulse width comprises a polarizing beam splitter, a quarter-wave plate, and a Pockels cell.

6. A driver laser according to claim 3, wherein said device that shortens width of pulses included in a laser beam to be output by cutting the laser beam into a desired pulse width comprises a germanium Brewster plate and a short-pulse laser device.

7. A driver laser according to claim 1, wherein said device that shortens width of pulses included in a laser beam to be output by cutting the laser beam into a desired pulse width comprises a first polarizing beam splitter, a second polarizing beam splitter, and a Pockels cell.

8. A driver laser according to claim 1, wherein said device that shortens width of pulses included in a laser beam to be output by cutting the laser beam into a desired pulse width comprises a polarizing beam splitter, a quarter-wave plate, and a Pockels cell.

9. A driver laser according to claim 1, wherein said device that shortens width of pulses included in a laser beam to be output by cutting the laser beam into a desired pulse width comprises a germanium Brewster plate and a short-pulse laser device.

10. A driver laser for an extreme ultra violet light source apparatus, said driver laser comprising:
 a short-pulse multi-line oscillated $CO_2$ laser oscillator having a spectrum with multiple spectral lines, said laser oscillator being for performing short-pulse multi-line oscillation, said laser oscillator including
  a first device for transmitting said multiple spectral lines therethrough, said first device having a wavelength-dependent transmittance that suppresses an intensity of a first spectral line of said multiple spectral lines exhibiting an peak energy value and does not suppress an intensity of a second spectral line of said multiple spectral lines not exhibiting the peak energy value, and
  a second device that shortens a width of pulses included in a laser beam to be output by cutting the laser beam into a desired pulse width; and
 at least one amplifier for receiving the laser beam output from said short-pulse multi-line oscillated $CO_2$ laser oscillator and for amplifying the laser beam to output an amplified laser beam.

11. A driver laser for an extreme ultra violet light source apparatus, said driver laser comprising:
 a short-pulse multi-line oscillated laser oscillator for performing short-pulse multi-line oscillation, said laser oscillator including
  a laser that outputs a short-pulsed laser beam, and
  an optical parametric oscillation device for receiving the laser beam output from said laser and causing optical parametric oscillation based on the laser beam output from said laser so as to output a short-pulsed laser beam having a wider bandwidth than the laser beam output from said laser;
 at least one amplifier for receiving an input laser beam and amplifying the input laser beam to output an amplified laser beam; and
 a spectrum matching box comprising a regenerative amplifier of a $CO_2$ laser, said spectrum matching box matching the laser beam having the wider bandwidth due to said optical parametric oscillation device with an oscillation spectrum of said at least one amplifier by converting the laser beam having the wider bandwidth into a laser beam having a comb-like spectrum.

12. A driver laser according to claim 11,
 wherein said regenerative amplifier comprises:
  a Pockels cell; and
  a polarization beam splitter, and
 wherein said $CO_2$ laser comprises a $CO_2$ laser resonator including a $CO_2$ laser medium and two reflection mirrors.

* * * * *